United States Patent
Dong et al.

(10) Patent No.: US 9,312,366 B1
(45) Date of Patent: Apr. 12, 2016

(54) PROCESSING OF INTEGRATED CIRCUIT FOR METAL GATE REPLACEMENT

(71) Applicant: International Business Machines Corporation, Armonk, NY (US)

(72) Inventors: Huihang Dong, Ridgefield, CT (US); Wai-Kin Li, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/665,704

(22) Filed: Mar. 23, 2015

(51) Int. Cl.
```
H01L 21/265    (2006.01)
H01L 29/66     (2006.01)
H01L 29/06     (2006.01)
H01L 21/31     (2006.01)
H01L 21/3105   (2006.01)
H01L 21/3213   (2006.01)
H01L 21/283    (2006.01)
H01L 21/762    (2006.01)
H01L 29/423    (2006.01)
```
(52) U.S. Cl.
CPC ........ *H01L 29/66795* (2013.01); *H01L 21/283* (2013.01); *H01L 21/31* (2013.01); *H01L 21/31056* (2013.01); *H01L 21/32135* (2013.01); *H01L 21/762* (2013.01); *H01L 29/0649* (2013.01); *H01L 29/4232* (2013.01)

(58) Field of Classification Search
CPC ............ H01L 29/66795; H01L 29/785; H01L 29/66545; H01L 21/823431; H01L 29/401; G03F 1/00
See application file for complete search history.

(56) References Cited

U.S. PATENT DOCUMENTS

| | | |
|---|---|---|
| 6,379,572 B1 | 4/2002 | Kikuchi et al. |
| 6,420,272 B1 | 7/2002 | Shen et al. |
| 8,178,417 B2 | 5/2012 | Mishra et al. |
| 8,673,165 B2 | 3/2014 | Raghunathan et al. |
| 8,703,557 B1 | 4/2014 | Cai et al. |
| 8,716,695 B2 | 5/2014 | Cohen et al. |
| 8,765,542 B1 | 7/2014 | Patzer et al. |

(Continued)

FOREIGN PATENT DOCUMENTS

JP     2007225950 A     9/2007

OTHER PUBLICATIONS

English translation of Foreign Patent Reference JP2007225950, 16 pages.

*Primary Examiner* — Jaehwan Oh
(74) *Attorney, Agent, or Firm* — Steven J. Meyers; Hoffman Warnick LLC

(57) ABSTRACT

Embodiments of the present disclosure provide a method of processing an integrated circuit (IC) structure for metal gate replacement, the method comprising: providing a structure including a first semiconductor fin and a second semiconductor fin positioned over a buried insulator layer of a silicon-on-insulator (SOI) substrate, and a gate structure positioned over the first and second semiconductor fins, wherein the gate structure includes a gate dielectric layer and a metal layer positioned over the gate dielectric layer; forming a planarizing resist over the first and second semiconductor fins, wherein the planarizing resist includes: a first organic planarizing layer (OPL), and a second OPL over the first OPL; removing a portion of the second OPL; removing an exposed portion of the first OPL and a portion of the metal layer positioned over the second semiconductor fin; and forming a replacement metal gate (RMG) over the gate dielectric layer.

20 Claims, 5 Drawing Sheets

(56) References Cited

U.S. PATENT DOCUMENTS

| | | |
|---|---|---|
| 8,809,174 B2 | 8/2014 | Seo et al. |
| 8,987,083 B1 * | 3/2015 | Hu .................. H01L 21/308 257/302 |
| 2013/0043592 A1 | 2/2013 | Park et al. |
| 2013/0175503 A1 | 7/2013 | Cohen et al. |
| 2014/0008720 A1 | 1/2014 | Xie et al. |
| 2014/0217482 A1 | 8/2014 | Xie et al. |
| 2014/0227869 A1 | 8/2014 | Reimer et al. |
| 2015/0021704 A1 * | 1/2015 | Zang .................. H01L 21/28088 257/369 |
| 2015/0044870 A1 | 2/2015 | Cheng et al. |
| 2015/0279744 A1 * | 10/2015 | Kwon ............. H01L 21/823828 438/585 |
| 2015/0348850 A1 * | 12/2015 | Lee .......................... G03F 1/00 438/587 |

* cited by examiner

PROCESSING OF INTEGRATED CIRCUIT FOR METAL GATE REPLACEMENT

BACKGROUND

The disclosure relates generally to manufacturing processes for field effect transistors (FETs). More specifically, embodiments of the present disclosure include processing an integrated circuit for metal gate replacement.

In integrated circuit (IC) structures, a transistor is a critical component for implementing digital circuitry designs. Generally, a transistor includes three electrical terminals: a source, a drain, and a gate. By applying different voltages to the gate terminal, the flow of electric current between the source and the drain can be turned on and off. A common type of transistor is a metal oxide field effect transistor (MOSFET). One type of MOSFET is a "FinFET," typically formed upon a semiconductor-on-insulator (SOI) layer and buried insulator layer. A FinFET can include a semiconductor structure etched into a "fin" shaped body, with one side of the fin acting as a source terminal and the other side of the fin acting as a drain terminal. A gate structure, which may include conductive materials such as metals, can be formed over one or more of the semiconductor fins. By applying a voltage to the gate structure, an electrically conductive channel can be created between the source and drain terminals of each fin in contact with the gate.

The gate of a transistor can be formed as a gate stack structure (i.e., a "metal gate stack") composed of a metal separated from the semiconductor material of the fin by a gate dielectric layer. Two processing paradigms for fabricating a gate stack can include a gate-first approach or a gate-last approach. The gate-last approach can also be known as a "replacement metal gate" (RMG) process flow, in which other portions of the transistor (e.g., fin, source and drain contacts, channel region, etc.) are formed using a dummy gate that is replaced with the final gate after fabrication of other parts. Although RMG processes can offer a lower thermal budget (i.e., the amount of thermal energy transferred to a wafer during a temperature treatment) and higher levels of advantageous strain in a resulting finFET, RMG processes are typically complex and can require more restrictive design rules. Thus, the performance of a finFET formed through an RMG process is at least partially dependent on the methods of processing and forming the finFET.

BRIEF SUMMARY

A first aspect of the disclosure provides a method of processing an integrated circuit (IC) structure for metal gate replacement, the method comprising: providing a structure including a first semiconductor fin and a second semiconductor fin positioned over a buried insulator layer of a silicon-on-insulator (SOI) substrate, and a gate structure positioned over the first and second semiconductor fins, wherein the gate structure includes a gate dielectric layer and a metal layer positioned over the gate dielectric layer; forming a planarizing resist over the first and second semiconductor fins, wherein the planarizing resist includes: a first organic planarizing layer (OPL), and a second OPL over the first OPL, wherein an etch selectivity of the second OPL is greater than an etch selectivity of the first OPL; removing a portion of the second OPL to create an exposed portion of the first OPL positioned over the second semiconductor fin; removing at least the exposed portion of the first OPL and a portion of the metal layer positioned over the second semiconductor fin to expose the gate dielectric layer over the second semiconductor fin; and forming a replacement metal gate (RMG) over the gate dielectric layer.

A second aspect of the disclosure provides a replacement metal gate (RMG) process. The process can include providing a structure including: providing a structure including: a first semiconductor fin positioned over a buried insulator layer, a second semiconductor fin positioned over the buried insulator layer, a dielectric layer positioned over the buried insulator layer, the first semiconductor fin, and the second semiconductor fin, wherein the dielectric layer includes a first trench over the first semiconductor fin and a second trench over the second semiconductor fin, and a gate structure positioned over the first semiconductor fin, the second semiconductor fin, and the dielectric layer, wherein the gate structure includes a gate dielectric layer and a metal layer positioned over the gate dielectric layer; forming a planarizing resist on the structure, the planarizing resist including: a first organic planarizing layer (OPL), and a second OPL over the first OPL, wherein an etch selectivity of the second OPL is greater than an etch selectivity of the first OPL; removing a portion of the second OPL to create an exposed portion of the first OPL located above the second semiconductor fin, wherein an upper surface of the exposed portion of the first OPL is positioned above an upper surface of the second trench; removing at least the exposed portion of the first OPL and a portion of the metal layer positioned over the second semiconductor fin to expose the gate dielectric layer over the second semiconductor fin; and forming a metal gate stack over the gate dielectric layer.

A third aspect of the disclosure provides a method of processing an integrated circuit (IC) structure for metal gate replacement. The method can include providing a structure including: a first semiconductor fin positioned over a buried insulator layer, a second semiconductor fin positioned over the buried insulator layer, a dielectric layer positioned over the buried insulator layer, the first semiconductor fin, and the second semiconductor fin, wherein the dielectric layer includes a first trench over the first semiconductor fin and a second trench over the second semiconductor fin, and a gate structure positioned over the first semiconductor fin, the second semiconductor fin, and the dielectric layer, wherein the gate structure includes a gate dielectric layer and a metal layer positioned over the gate dielectric layer; forming a planarizing resist over the structure, the planarizing resist including: a first organic planarizing layer (OPL), and a second OPL positioned on the first OPL, wherein an etch selectivity of the second OPL is greater than an etch selectivity of the first OPL; removing a portion of the second OPL to create an exposed portion of the first OPL positioned above the second semiconductor fin, wherein an upper surface of the exposed portion of the first OPL is positioned above an upper surface of the second trench; removing at least the first OPL and a portion of the metal layer positioned over the second semiconductor fin to create an exposed portion of the gate dielectric layer positioned over the second semiconductor fin; removing the first and second OPLs; removing a portion of the metal layer over the first semiconductor fin to create an exposed portion of the gate dielectric layer positioned over the first semiconductor fin; and forming a first metal gate stack within the first trench and a second metal gate stack within the second trench.

The illustrative aspects of the present disclosure are designed to solve the problems herein described and/or other problems not discussed.

BRIEF DESCRIPTION OF THE DRAWINGS

These and other features of this disclosure will be more readily understood from the following detailed description of the various aspects of the disclosure taken in conjunction with the accompanying drawings that depict various embodiments of the disclosure, in which.

It is noted that the drawings of the disclosure are not to scale. The drawings are intended to depict only typical aspects of the disclosure, and therefore should not be considered as limiting the scope of the disclosure. In the drawings, like numbering represents like elements among the drawings.

DETAILED DESCRIPTION

Embodiments of the present disclosure provide methods of processing an integrated circuit (IC) structure for metal gate replacement, e.g., replacement metal gate (RMG) processes. Generally, processes according to the present disclosure can provide processes of forming a transistor structure, such as a fin-structured field effect transistor ("finFET"). According to embodiments, a planarizing resist with two different organic planarizing layers (OPLs) can be formed over two semiconductor fins, before later being removed for metal gate stacks to be formed over the first and/or second semiconductor fins.

To provide manufacturability and reduced current leakage in a transistor structure, embodiments of the present disclosure provide for the forming of a planarizing resist with two organic planarizing layers (OPLs) over a structure with semiconductor fins. A "planarizing layer" generally refers to any material used for flattening the surface of a wafer, which can be formed by the deposition of material followed by polishing, deposition followed by the forming of a flowable oxide material thereon, deposition alone, and/or any other currently known or later developed process or combination of processes. In conventional processes, a planarizing resist composed of a single OPL can be formed with a hard mask and photoresist layer thereon, before patterning processes occur and the planarizing resist is removed and replaced with a metal gate stack. It has been discovered that in this conventional process, removing the hard mask from the planarizing resist can be challenging because the dry or wet etching used to remove the hard mask can also damage gate dielectric materials positioned over underlying semiconductor fins. According to the present disclosure, a second OPL can be formed on the first OPL and may have a greater etch selectivity (i.e., greater resistance to wet and dry etching processes and thereby a lower etch rate during processing) than the first OPL. This difference in the etch selectivity of each OPL can allow a portion of the planarizing layer to remain present over semiconductor fins during the removal of a hard mask with dry or wet etching. The remaining portion of the OPL can thus protect gate dielectric materials over the semiconductor fins from being affected when the hard mask is removed. Forming a planarizing resist with two OPLs can thus reduce the amount of electrical current leakage in a resulting finFET transistor, and thus can provide a more stable threshold voltage (i.e., minimum voltage needed to form a conductive channel) of the finFET during operation.

Figure 1:
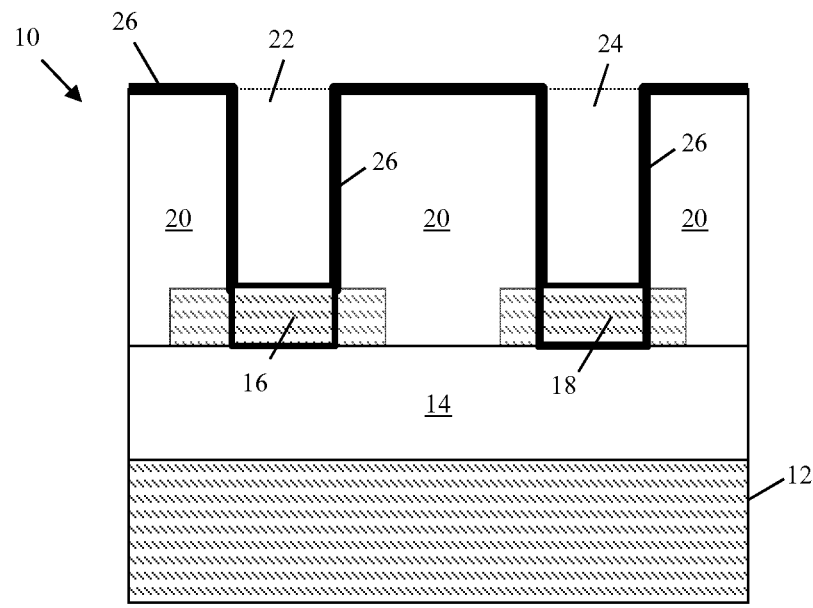
FIG. 1 shows a cross-sectional view of an initial structure according to embodiments of the present disclosure.

Turning to FIG. 1, an initial structure according to aspects of the present disclosure is shown. Structure 10 can be fabricated according to preliminary process steps and/or can be provided by an independent user or third party. Structure 10 can be in the form of, e.g., an intermediate semiconductor wafer structure from which one or more transistors can be fabricated. A substrate 12 of structure 10 can be composed of any currently known or later developed semiconductor material, which may include without limitation: silicon, germanium, silicon carbide, and substances consisting essentially of one or more III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions, each greater than or equal to zero and X1+X2+X3+Y1+Y2+Y3+Y4=1 (1 being the total relative mole quantity). Other suitable substances can include II-VI compound semiconductors having a composition $Zn_{A1}Cd_{A2}Se_{B1}Te_{B2}$, where A1, A2, B1, and B2 are relative proportions each greater than or equal to zero and A1+A2+B1+B2=1 (1 being a total mole quantity). Furthermore, the entirety of substrate 12 or a portion thereof may be strained.

A buried insulator layer 14 can be formed on and positioned over substrate 12. Buried insulator layer 14 may be composed of any insulating material such as $SiO_2$ or a dielectric having a high dielectric constant, which may be, for example, above 3.9. In some situations, buried insulator layer 14 may be composed of an oxide substance, and correspondingly may be referred to as a buried oxide (BOX) layer. Materials appropriate for the composition of buried insulator layer 14 may include, for example, silicon dioxide ($SiO_2$), silicon nitride (SiN), hafnium oxide ($HfO_2$), alumina ($Al_2O_3$), yttrium oxide ($Y_2O_3$), tantalum oxide ($Ta_2O_5$), titanium dioxide ($TiO_2$), praseodymium oxide ($Pr_2O_3$), zirconium oxide ($ZrO_2$), erbium oxide ($ErO_x$), and other currently known or later developed materials having similar properties.

A first semiconductor fin 16 and a second semiconductor fin 18 can be formed on buried insulator layer 14. Initially, semiconductor fins 16, 18 can be formed as a single layer of semiconductive material which is later processed into individual components, shown in FIG. 1 as first and second semiconductor fins 16, 18. For example, first and second semiconductor fins 16, 18, may be remaining portions of a single semiconductor-on-insulator (SOI) substrate composed of a layer of semiconductor material bonded to and positioned over buried insulator layer 14 and substrate 12. Although two semiconductor fins 16, 18, are shown by example in FIGS. 1-9, it is understood that processes according to the present disclosure can use any conceivable number of semiconductor fins 16, 18. An example process by which semiconductor fins 16, 18 can be formed on buried insulator layer 14, e.g., as part of an SOI substrate, is wafer bonding. "Wafer bonding" generally refers to a process in which two semiconductor wafers are bonded together, forming a single substrate material. The bonded semiconductor wafers can be cut using any currently known or later developed semiconductor or SOI fabrication process. As one example, a semiconductor material can be formed by implanting a bonded wafer with hydrogen and then annealing the wafer, causing it to split along the plane of the implanted hydrogen. First and second semiconductor fins 16, 18 can be composed of, for example, silicon or another semiconductor material, and optionally may have the same material composition as substrate 12.

IC structures 10 processed according to embodiments of the present disclosure can be used to form one or more resulting finFETs. A finFET refers to a transistor typically built from an SOI substrate, where semiconductor material positioned on a buried insulator layer is etched into one or more fin-shaped structures to act as a channel. A gate component and/or other elements of the resulting finFET can be formed around and over the fin(s), as detailed in other process steps outlined herein. Following the formation of semiconductor layer 16, one or more semiconductor fins 18 can be formed therefrom via any currently known or later developed process of removing a portion of a semiconductor material, e.g., depositing a material and performing a pattern etch. As used herein, the term "depositing" may include any now known or later developed technique appropriate for deposition, including but not limited to, for example: chemical vapor deposition (CVD), low-pressure CVD (LPCVD), plasma-enhanced CVD (PECVD), sub-atmosphere CVD (SACVD) high density plasma CVD (HDPCVD), rapid thermal CVD (RTCVD), ultra-high vacuum CVD (UHVCVD), limited reaction processing CVD (LRPCVD), metalorganic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, and evaporation. In addition, "removing" as used herein can include any one of various material removal or polishing techniques now known or later developed, e.g., etching, wet etching, a reactive ion etch (RIE), etc. "RIE" or "reactive ion etch" refers to a variation of plasma etching in which, during etching, a semiconductor wafer is placed on an RF powered electrode. Throughout RIE, the wafer may take on an electric potential which accelerates the etching species extracted from plasma toward the etched surface.

As discussed elsewhere herein, structure 10 can include two semiconductor fins 16, 18, or any other desired number of semiconductor fins. In alternative embodiments, semiconductor fins 16, 18 can be formed by removing portions of buried insulator layer 14 and forming semiconductive material therein (e.g., by deposition). Although first and second semiconductor fins 16, 18 are shown by example as protruding from buried insulator layer 14, it is understood that embodiments of the present disclosure can be applied to first and second semiconductor fins 18 which extend wholly or partially through buried insulator layer 14, optionally contacting substrate 12. First and second semiconductor fins 16, 18, can be components of PFET and/or NFET transistors. A PFET transistor generally refers to a transistor with a p-type doped fin (i.e., source and drain regions), while an NFET transistor generally refers to a transistor with an n-type doped fin (i.e., source and drain regions). In a PFET, holes are responsible for conduction of electricity across the channel, while electrons are responsible for conduction of electricity across the channel in an NFET.

Structure 10 can include a dielectric layer 20 formed over buried insulator layer 14 and at least partially over first and second semiconductor fins 16, 18. Dielectric layer 20 can be composed of any currently known or later developed electrically insulating material, and as an example can be composed of a "high-k" dielectric (i.e., materials with a dielectric constant of at least 3.9), including one or more of the example materials discussed herein with respect to buried insulator layer 14. Dielectric layer 20 can initially be formed as a single, continuous layer, but can later be processed to include trenches, cavities, etc., as discussed herein. Specifically, dielectric layer 20 of structure 10 can further include a first trench 22 and a second trench 24, each extending between an upper surface of dielectric layer 20 and an upper surface of first semiconductor fin 16 or second semiconductor fin 18. Each trench 22, 24 can have a thickness of between, e.g., approximately two nanometers (nm) and approximately twenty nm. As used herein, the term "approximately" in relation to a specified numerical value (including percentages of base numerical values) can include all values within ten percentage points of (i.e., above or below) the specified numerical value or percentage, and/or all other values which cause no operational difference or substantial operational difference between the modified value and the enumerated value. The term approximately can also include other specific values or ranges where specified herein. In addition, embodiments of the present disclosure can include forming dielectric layer 20 in addition to first and second trenches 22, 24, therein on buried insulator layer and first and second semiconductor fins 16, 18 of structure 10. Any currently known or later developed selective removal process, such as patterning with wet or dry etching, can form first and second trenches 22, 24 in dielectric layer 20. Patterning generally refers to the combined process of forming a mask upon a layer of material (e.g., by depositing a photoresist layer and/or other etch-resistant materials thereon) before removing portions of the material not covered by the photoresist layer and/or other resistant materials.

Figure 2:
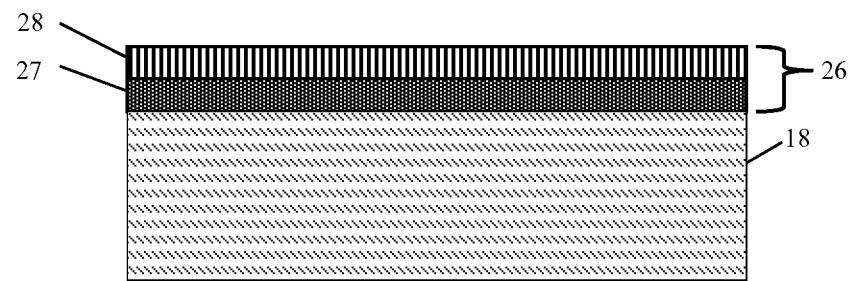
FIG. 2 shows a cross-sectional view of a gate structure over a semiconductor fin according to embodiments of the present disclosure.

Turning to FIG. 2, a gate structure 26 positioned over dielectric layer 20 (FIG. 1), first semiconductor fin 16 (FIG. 1), and second semiconductor fin 18. Only second semiconductor 18 is shown by example in FIG. 2, but it is understood that the layered composition of gate structure 26 is also present over, e.g., dielectric layer 20 and first semiconductor fin 16. Gate structure 26 can include a gate dielectric 27 positioned over and contacting second semiconductor fin 18, and can include one or more high-k dielectric materials discussed generally herein and/or can include other materials. As examples, gate dielectric 27 can include silicon oxide ($SiO_2$), hafnium oxide ($HfO_2$), zirconium silicate ($ZrSiO_4$), and/or other types of dielectric materials. Gate structure 26 can also include a metal layer 28 positioned over and contacting gate dielectric 27. Metal layer 28 can generally be composed of a high-k metallic layer or high work function metal, such as those used in the fabrication of metal MOS gates. As examples, gate structure 26 can be composed of, e.g., aluminum (Al), aluminum-silicon alloys (Al—Si), titanium silicide ($TiSi_2$), titanium nitride (TiN), tungsten (W), molybdenum disilicide ($MoSi_2$), platinum silicide (PtSi), cobalt silicide ($CoSi_2$), tungsten silicide (WSi2), etc. Metal layer 28 may have formed a portion of a dummy gate material used in preliminary processing steps. As is discussed elsewhere herein, metal layer 28 can later be removed during the processing of some types of finFETs (e.g., PFET transistors) to expose gate dielectric 27 before forming a replacement metal gate over semiconductor fins, e.g., second semiconductor fin 18. For other types of finFETs (e.g., NFET transistors), the user may wish to leave metal layer 28 of gate structure 26 intact before forming a replacement metal gate thereon. Embodiments of the present disclosure, as discussed elsewhere herein, can accommodate both of these situations in addition to other scenarios not specifically discussed.

Figure 3:
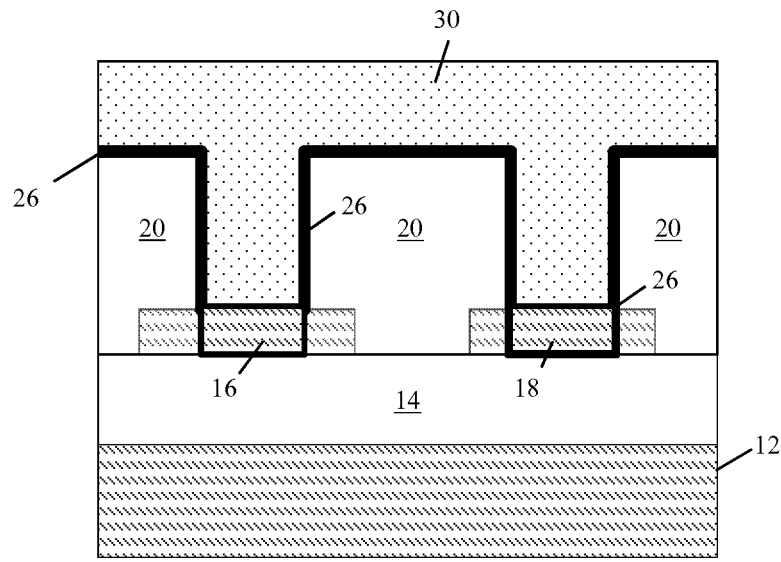
FIG. 3 shows a cross-sectional view of a process of forming a first organic planarizing layer of a planarizing resist according to embodiments of the present disclosure.

Turning to FIG. 3, a step for the processing of structure 10 (FIG. 1) according to the present disclosure is shown. To begin forming a planarizing resist according to embodiments of the present disclosure, a first OPL 30 can be formed over semiconductor fins 16, 18, and dielectric layer 20. First OPL 30 can fill first and second trenches 22, 24, thereby providing an initial planarizing structure over gate structure 26, dielectric layer 20, and/or first and second semiconductor fins 16, 18. First OPL 30 can be formed by deposition and/or any other currently known or later developed process of forming an at least partially conductive material or a metal on another component. In an embodiment, first OPL 30 can be in the form of a single-layered pure substance or mixture which includes any currently known or later developed planarizing substance. As specific examples, first OPL 30 can be in the form of an organic (i.e., carbon based) dielectric layer (ODL) such as ODL-102 and/or ODL-401 (two proprietary materials commercially available from ShinEtsu Chemical, Co., Ltd.). An initial thickness of first OPL 30 relative to first and second semiconductor fins 16, 18 and the upper surface of OPL 30 can be between, e.g., approximately seventy nm and approximately one-hundred and fifty nm. At least some portions of first OPL 30 can also be formed over and/or in contact with buried insulator layer 14 in addition to first and second semiconductor fins 16, 18. Contact between first OPL 30 and buried insulator layer 14 is omitted from FIG. 3 for the purposes of clarity, and it is understood that buried insulator layer 14 can extend laterally beyond the surface area where semiconductor fin 18 contacts buried insulator layer 14.

Figure 4:
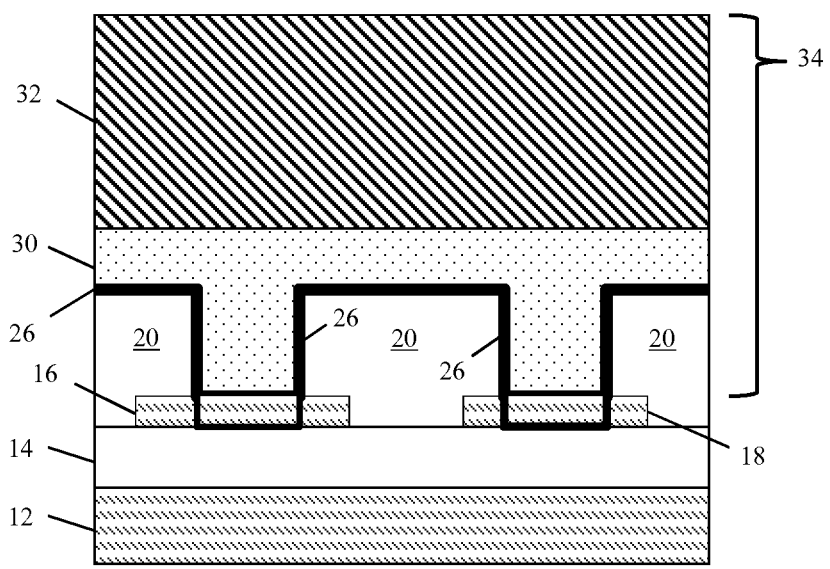
FIG. 4 shows a process of forming a second organic planarizing layer of a planarizing resist according to embodiments of the present disclosure.

Turning to FIG. 4, a step for forming second OPL 32 over first OPL 30, e.g., to create a planarizing resist 34 is shown. The forming of planarizing resist 34 with first and second OPLs 30, 32 can reduce current leakage from a resulting finFET, e.g., by allowing portions thereof to protect gate structure 26 during further process steps (e.g., removal of hard masks by dry or wet etching). Second OPL 32 can be composed of a different material from first OPL 30, and more specifically, can have a greater etch selectivity (i.e., lower etch rate) than first OPL 30. As an example, second OPL 32 can be composed of one or more carbon films with greater etch selectivity than the organic dielectric layer or other material used to form first OPL 30. The thickness of second OPL 32 can be greater than the thickness of first OPL 30, and as an example can be between, e.g., approximately two-hundred nm and approximately four-hundred nm. First and second OPLs 30, 32 together can make up one or more planarizing resists 34 positioned over first and/or second semiconductor fins 16, 18. The difference in etch selectivity between first and second OPLs 30, 32, can allow a selective removing of a portion of second OPL 32 to substantially terminate before a significant removing of first OPL 30 occurs. The terms "substantial termination" or "substantially terminate" are discussed in further detail elsewhere herein.

Figure 5:
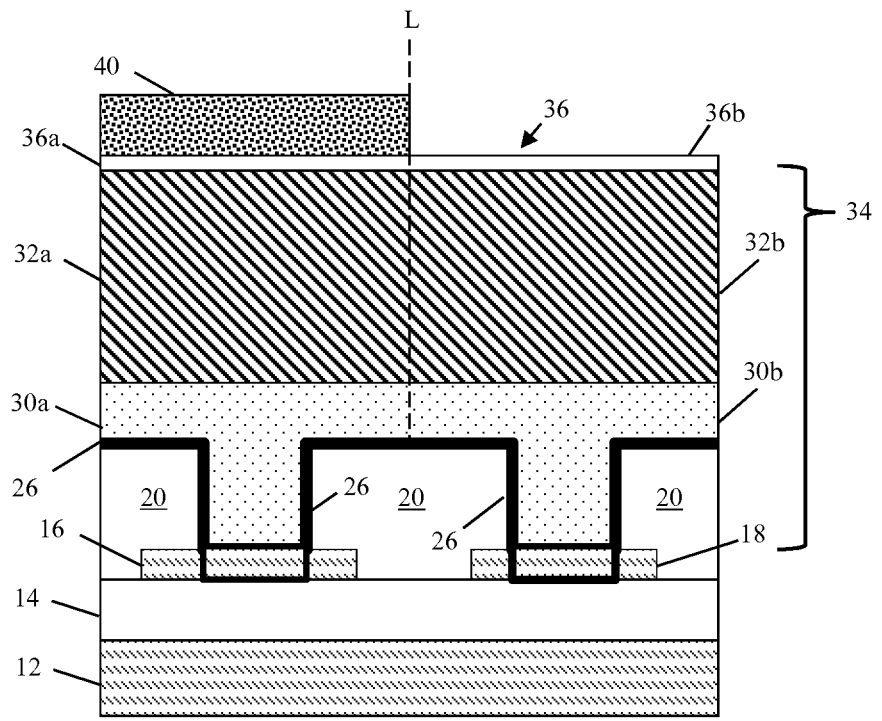
FIG. 5 shows a process of forming a hard mask and photoresist layer over a planarizing resist according to embodiments of the present disclosure.

Turning to FIG. 5, processes for patterning planarizing resist 34 for later removal according to the present disclosure are shown. Embodiments of the present disclosure can include forming a hard mask 36 over the upper surface of planarizing resist 34. The term "mask" and/or "hard mask" may refer to a layer of material which is applied over an underlying layer of material, e.g., planarizing resist 34, to protect at least a portion of the underlying material from further processing steps (e.g., dry etching or wet etching), and/or to further protect any structures covered by a photoresist. Common masking materials are photoresist (resist) and nitride. Nitride can be an example type of a hard masking material. Other suitable materials for hard mask 36 can include, e.g., amorphous carbon, low-temperature oxides (LTOs) such as crystalline silicon oxynitride (SiON), and layered materials including several masking substances. Hard mask 36 can be formed, e.g., by being deposited over planarizing resist 34.

In addition, a photoresist layer 40 can be formed on hard mask 36, thereby covering a corresponding portion of first and second OPLs 30, 32 of planarizing resist 34. The position of photoresist layer 40 can divide planarizing resist 34 (e.g., along reference line "L") into a portion positioned generally over first semiconductor fin 16 and a portion positioned generally over second semiconductor fin 18. In the example of FIG. 4, photoresist layer 40 can cover first OPL 30a, second OPL 32a, and hard mask 36a positioned over first semiconductor fin 16. In this example, first OPL 30b, second OPL 32b, and hard mask 36b positioned over second semiconductor fin 18 are not covered by photoresist layer 40 and thus can be wholly or partially removed. Further processes discussed herein (e.g., dry and wet etching) can thus remove portions of first OPL 30b, second OPL 32b, and hard mask 36b not covered by photoresist layer 40.

Figure 6:
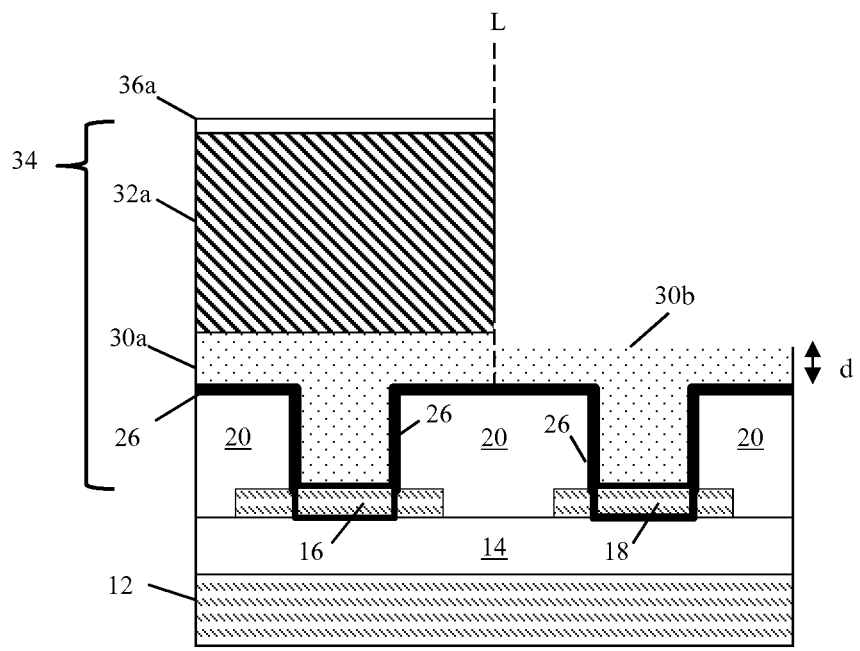
FIGS. 6-7 show processes of removing portions of a hard mask and planarizing resist according to embodiments of the present disclosure.

Turning to FIG. 6, a step for removing photoresist layer 40 and portions of second OPL 32 from planarizing resist 34 according to the present disclosure is shown. More specifically, processes according to the present disclosure can include selectively removing (e.g., by selective etching) some materials not covered by photoresist layer 40, e.g., second OPL 32b (FIG. 5) and hard mask 36b (FIG. 5) to create an exposed portion of first OPL 30b. The selective removing of both second OPL 32b and hard mask 36b can be completed, e.g., by RIE and/or other processes for etching or removal of structures. The difference in etch selectivity between first OPL 30 and second OPL 32 can allow the removing of second OPL 32b to substantially terminate before a subsequent removing of first OPL 30b. As used herein, "substantial termination" of etching or the term "substantially terminate" refers to a termination of etching in which a negligible portion of first OPL 30b (i.e., at most approximately 5% of the thickness of first OPL 30b measured from second semiconductor fin 18) is also removed during the selective removal of second OPL 32b. An upper surface of exposed first OPL 30b can extend a distance "d" above an upper surface of dielectric layer 20. Distance d can be, e.g., between approximately twenty nm and approximately fifty nm. After first OPL 30b is exposed, photoresist layer 40 can be removed, e.g., by being stripped away from planarizing resist 34.

Figure 7:
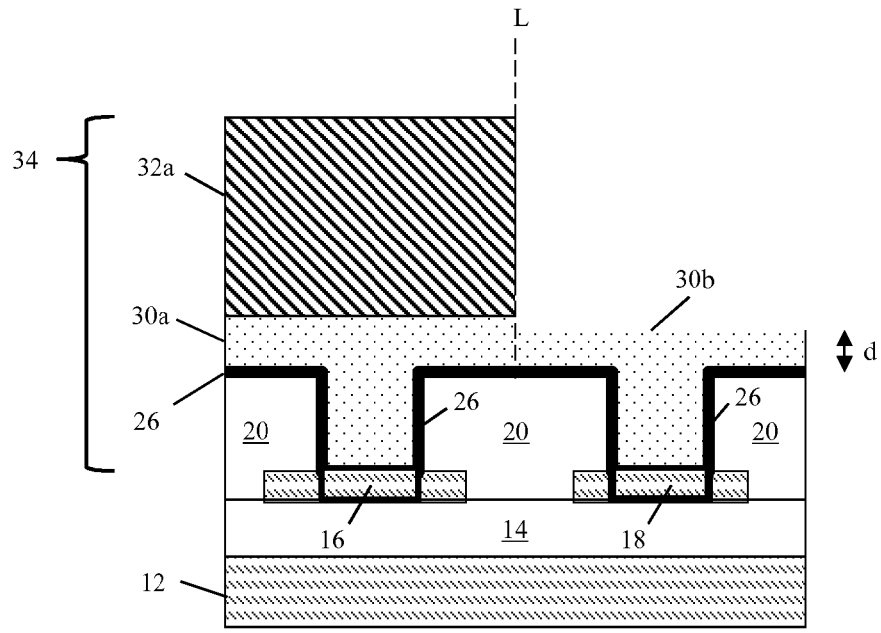

Referring now to FIG. 7, the remaining portion of hard mask 36a can be removed after exposing first OPL 30b. The removing of hard mask 36a can be performed, e.g., by stripping hard mask 36a (FIG. 6) from second OPL 32a, by selective dry or wet etching, and/or any other applicable process for the selective removing of hard mask material(s). First OPL 30b extending distance d above the upper surfaces of dielectric layer 20 can protect dielectric layer 20 and gate structure 26 from being affected as hard mask 36a is removed from second OPL 32a, e.g., by a non-selective dry or wet etching process. Following the complete removal of the two portions of hard mask 36 (i.e., hard masks 36a, 36b) (FIG. 5), first and second OPLs 30a, 32a of planarizing resist 34 can remain intact with approximately their initial thickness over first semiconductor fin 16, while a portion of first OPL 30b (extending distance d above dielectric layer 20) of planarizing resist 34 can remain intact over second semiconductor fin 18.

Figure 8:
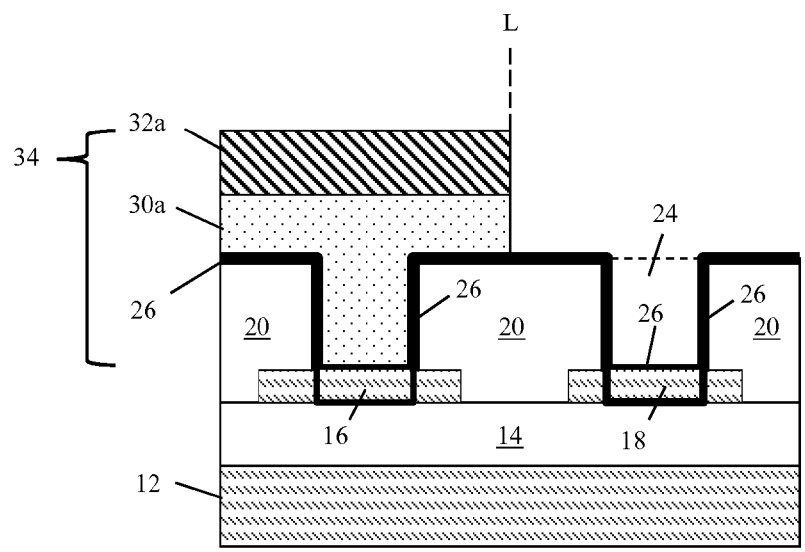
FIGS. 8-9 show processes for removing a layer of the planarizing resist and metal layer over one semiconductor fin according to embodiments of the present disclosure.

Turning to FIG. 8, further processing of structure 10 (FIG. 1) can include removing at least the exposed first OPL 30b (FIG. 6) to expose gate structure 26 over first or second semiconductor fin 16, 18 (second semiconductor fin 18 and gate structure 26 exposed by example in FIG. 7). Removing first OPL 30a can expose second semiconductor fin 18 (e.g., a PFET semiconductor fin) and/or gate structure 26 within second trench 24. It is also understood that removing first OPL 30a may expose first semiconductor fin 16 (e.g., an NFET semiconductor fin) and/or gate structure 26 within first trench 22 (FIG. 1) in alternative embodiments based on the location of photoresist layer 40 (FIG. 5). The removing of first OPL 30b can be performed by way of simultaneous, non-selective etching, such that portions of second OPL 32a are removed from planarizing resist 34 simultaneously with the remainder of first OPL 30b. The removing of first OPL 30b from planarizing resist 34 can expose gate structure 26 of second semiconductor fin 18.

Figure 9:
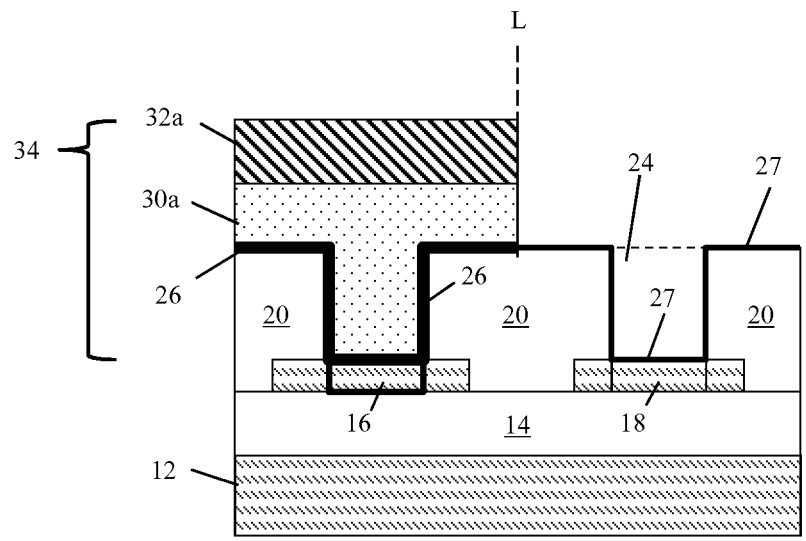

Turning to FIG. 9, a portion of metal layer 28 (FIG. 2) of gate structure 26, positioned over second semiconductor fin 18, can be removed as a preliminary step to metal gate replacement within second trench 24. The removing of metal layer 28 can be performed with any currently known or later developed process for the removing of a metallic layer, and as an example can include selective wet or dry etching of metal layer 28 from gate structure 26. The removing of metal layer 28 can further include the removing of metal layer 28 from portions of gate structure 26 over dielectric layer 20 as shown in FIG. 9. In any event, removing metal layer 28 from second semiconductor fin 18 can expose gate dielectric 27 and allow replacement gate stack materials to be formed directly on gate dielectric 27 over first or second semiconductor fin(s) 16, 18. The removing of metal layer 28 from second semiconductor fin 18 and/or dielectric layer 20 can have no substantial effect on the remaining first OPL 30a and second OPL 32a of planarizing resist 34, thereby preserving other portions of gate structure 26 underneath first OPL 30a.

Figure 10:
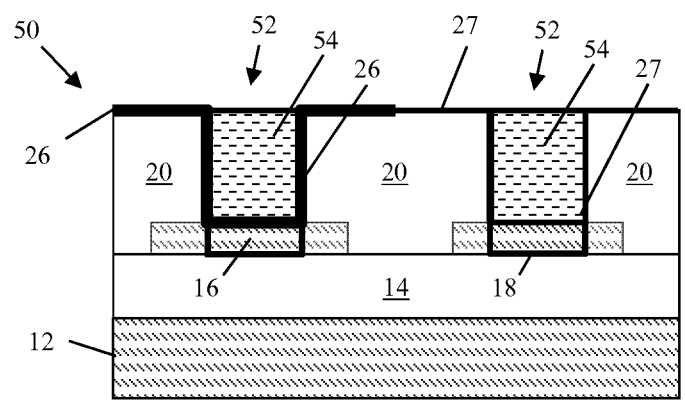
FIG. 10 shows a cross-sectional view of an IC structure with a replacement metal gate (RMG) according to embodiments of the present disclosure.

Turning to FIG. 10, an IC structure 50 resulting from processes according to the present disclosure is shown. Following the removal of first and second OPLs 30b, 32b, (FIGS. 5-9) and portions of metal layer 28, further processing can include removing planarizing resist 34 (FIGS. 4-9) (i.e., the remaining portions of first and second OPLs 30a, 32a) to expose gate structure 26 (FIGS. 1-9) over first semiconductor fin 16 (e.g., a PFET or NFET semiconductor fin) and first trench 22 (FIG. 1). The removing of planarizing resist 34 can be performed, e.g., by stripping or etching away the remaining organic planarizing layers 30, 32.

Additional processing steps can include forming replacement metal gate (RMG) stacks 52 within first and second trenches 22 (FIG. 1), 24 (FIGS. 1, 8, 9). Each RMG stack 52 can include, e.g., a gate metal 54 separated from its corresponding semiconductor fin 16, 18 by gate dielectric 27. Alternatively, where metal layer 28 is not removed from a particular semiconductor fin 16, 18 (e.g., over first semiconductor fin 16), gate metal 54 can contact and/or be positioned on metal layer 26. Gate metal 54 can be in the form of any currently known or later developed conductive material such as, e.g., aluminum (Al), zinc (Zn), indium (In), copper (Cu), indium copper (InCu), tin (Sn), tantalum (Ta), tantalum nitride (TaN), tantalum carbide (TaC) titanium (Ti), titanium nitride (TiN), titanium carbide (TiC), tungsten (W), tungsten nitride (WN), tungsten carbide (WC), and/or polysilicon (poly-Si) or combinations thereof.

Embodiments of the present disclosure can provide commercial and technical advantages, some of which are discussed by way of example herein. Embodiments of the present disclosure can protect underlying circuit components and/or reduce current leakage in a resulting finFET transistor or other structure, thereby stabilizing threshold voltage. In addition, embodiments disclosed herein provide a procedure for isolating a gate dielectric positioned over a semiconductor fin by using a planarizing resist with two different OPL compositions, before later removing a hard mask and removing the planarizing resist. In embodiments of the present disclosure, a portion of the planarizing resist over a metal layer and gate dielectric protects these materials from damage during the removal of a hard mask. Following hard mask removal, a metal layer positioned over the gate dielectric and one of the semiconductor fins can be removed and replacement metal gate structures can be formed, resulting in a device with reduced current leakage as compared to conventional processes. Furthermore, using two OPLs with different etch rates in a planarizing resist can broaden the available types of hard mask materials, as compared to conventional processes where the risk of damage to other layers and components can limit the types of hard masks to be formed over a planarizing resist.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

What is claimed is:
1. A method of processing an integrated circuit (IC) structure for metal gate replacement, the method comprising:
   providing a structure including a first semiconductor fin and a second semiconductor fin positioned over a buried insulator layer of a silicon-on-insulator (SOI) substrate, and a gate structure positioned over the first and second semiconductor fins, wherein the gate structure includes a gate dielectric layer and a metal layer positioned over the gate dielectric layer;
   forming a planarizing resist over the first and second semiconductor fins, wherein the planarizing resist includes:
      a first organic planarizing layer (OPL), and
      a second OPL over the first OPL, wherein an etch selectivity of the second OPL is greater than an etch selectivity of the first OPL, to enable a removal of the second OPL to substantially terminate before a subsequent removing of the first OPL;
   removing a portion of the second OPL to create an exposed portion of the first OPL positioned over the second semiconductor fin, wherein the removing substantially terminates before removal of the exposed portion of the first OPL, based on the etch selectivity of the second OPL being greater than the etch selectivity of the first OPL;

removing at least the exposed portion of the first OPL and a portion of the metal layer positioned over the second semiconductor fin to expose the gate dielectric layer over the second semiconductor fin; and forming a replacement metal gate (RMG) over the gate dielectric layer over the second semiconductor fin.

2. The method of claim 1, wherein the first OPL comprises an organic dielectric layer, and the second OPL comprises a carbon film.

3. The method of claim 1, wherein the removing of the portion of the second OPL comprises a selective etching process, and the removing of at least the exposed portion of the first OPL and the portion of the metal layer positioned over the second semiconductor fin comprises a non-selective etching process.

4. The method of claim 1, wherein an initial thickness of the first OPL is between approximately 70 nanometers (nm) and approximately 150 nm.

5. The method of claim 4, wherein an initial thickness of the second OPL is between approximately 200 nm and approximately 400 nm.

6. The method of claim 1, wherein the first semiconductor fin and the second semiconductor fin each comprise portions of at least one finFET.

7. The method of claim 1, further comprising forming a hard mask on the planarizing resist before the removing of the portion of the second OPL.

8. The method of claim 1, further comprising:

forming a dielectric layer over the buried insulator layer, the first semiconductor fin, and the second semiconductor fin, wherein the dielectric layer includes a first trench positioned over the first semiconductor fin and a second trench positioned over the second semiconductor fin;

wherein an upper surface of the exposed portion of the first OPL is positioned above an upper surface of the first trench.

9. The method of claim 1, further comprising removing the first and second OPLs after the removing of the portion of the metal layer positioned over the second semiconductor fin.

10. The method of claim 9, further comprising forming a replacement metal gate (RMG) over the first semiconductor fin.

11. A replacement metal gate (RMG) process comprising:
providing a structure including:
a first semiconductor fin positioned over a buried insulator layer,
a second semiconductor fin positioned over the buried insulator layer,
a dielectric layer positioned over the buried insulator layer, the first semiconductor fin, and the second semiconductor fin, wherein the dielectric layer includes a first trench over the first semiconductor fin and a second trench over the second semiconductor fin, and
a gate structure positioned over the first semiconductor fin, the second semiconductor fin, and the dielectric layer, wherein the gate structure includes a gate dielectric layer and a metal layer positioned over the gate dielectric layer;
forming a planarizing resist on the structure, the planarizing resist including:
a first organic planarizing layer (OPL), and
a second OPL over the first OPL, wherein an etch selectivity of the second OPL is greater than an etch selectivity of the first OPL, to enable a removal of the second OPL to substantially terminate before a subsequent removing of the first OPL;

removing a portion of the second OPL to create an exposed portion of the first OPL located above the second semiconductor fin, wherein the removing substantially terminates before removal of the exposed portion of the first OPL, based on the etch selectivity of the second OPL being greater than the etch selectivity of the first OPL, and wherein an upper surface of the exposed portion of the first OPL is positioned above an upper surface of the second trench;

removing at least the exposed portion of the first OPL and a portion of the metal layer positioned over the second semiconductor fin to expose the gate dielectric layer over the second semiconductor fin; and forming a metal gate stack over the gate dielectric layer over the second semiconductor fin.

12. The process of claim 11, wherein the planarizing resist further includes a hard mask positioned over the second OPL, and wherein the removing of the portion of the second OPL further includes removing a portion of the hard mask positioned over the second semiconductor fin.

13. The process of claim 11, wherein the first OPL comprises an organic dielectric layer, and the second OPL comprises a carbon film.

14. The process of claim 11, wherein the removing of the portion of the second OPL comprises a selective etching process, and the removing of at least the exposed portion of the first OPL and the portion of the metal layer positioned over the second semiconductor fin comprises a non-selective etching process.

15. The process of claim 11, wherein an initial thickness of the first OPL is between approximately 70 nanometers (nm) and approximately 150 nm, and an initial thickness of the second OPL is between approximately 200 nm and approximately 400 nm.

16. The process of claim 11, further comprising removing the first and second OPLs after the removing of the portion of the metal layer positioned over the second semiconductor fin.

17. The process of claim 16, further comprising forming a replacement metal gate (RMG) over the first semiconductor fin without removing a portion of the metal layer positioned over the first semiconductor fin.

18. A method of processing an integrated circuit (IC) structure for metal gate replacement, the method comprising:
providing a structure including:
a first semiconductor fin positioned over a buried insulator layer,
a second semiconductor fin positioned over the buried insulator layer,
a dielectric layer positioned over the buried insulator layer, the first semiconductor fin, and the second semiconductor fin, wherein the dielectric layer includes a first trench over the first semiconductor fin and a second trench over the second semiconductor fin, and
a gate structure positioned over the first semiconductor fin, the second semiconductor fin, and the dielectric layer, wherein the gate structure includes a gate dielectric layer and a metal layer positioned over the gate dielectric layer;
forming a planarizing resist over the structure, the planarizing resist including:
a first organic planarizing layer (OPL), and
a second OPL positioned on the first OPL, wherein an etch selectivity of the second OPL is greater than an etch selectivity of the first OPL, to enable a removal of the second OPL to substantially terminate before a subsequent removing of the first OPL;

removing a portion of the second OPL to create an exposed portion of the first OPL positioned above the second semiconductor fin, wherein the removing substantially terminates before removal of the exposed portion of the first OPL, based on the etch selectivity of the second OPL being greater than the etch selectivity of the first OPL, and wherein an upper surface of the exposed portion of the first OPL is positioned above an upper surface of the second trench;

removing at least the first OPL and a portion of the metal layer positioned over the second semiconductor fin to create an exposed portion of the gate dielectric layer positioned over the second semiconductor fin;

removing the first and second OPLs to create an exposed portion of the metal layer positioned over the first semiconductor fin; and forming a first metal gate stack within the first trench and a second metal gate stack within the second trench.

19. The method of claim 18, wherein the first OPL comprises an organic dielectric layer, and the second OPL comprises a carbon film.

20. The method of claim 18, wherein the planarizing resist further includes a hard mask positioned over the second OPL, and wherein the removing of the portion of the second OPL further includes removing a portion of the hard mask positioned over the second semiconductor fin.

* * * * *